US009378963B2

(12) United States Patent
Yeh

(10) Patent No.: US 9,378,963 B2
(45) Date of Patent: Jun. 28, 2016

(54) SELF-ALIGNED CONTACT AND METHOD OF FORMING THE SAME

(71) Applicant: Taiwan Semiconductor Manufacturing Co., Ltd., Hsin-Chu (TW)

(72) Inventor: Cheng-Hao Yeh, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 107 days.

(21) Appl. No.: 14/159,582

(22) Filed: Jan. 21, 2014

(65) Prior Publication Data

US 2015/0206753 A1    Jul. 23, 2015

(51) Int. Cl.
H01L 21/283 (2006.01)
H01L 21/311 (2006.01)
H01L 21/308 (2006.01)
H01L 21/265 (2006.01)
H01L 21/3213 (2006.01)
H01L 21/3215 (2006.01)

(52) U.S. Cl.
CPC .......... H01L 21/283 (2013.01); H01L 21/3081 (2013.01); H01L 21/3086 (2013.01); H01L 21/31111 (2013.01); H01L 21/31144 (2013.01); H01L 21/26506 (2013.01); H01L 21/32134 (2013.01); H01L 21/32135 (2013.01); H01L 21/32155 (2013.01)

(58) Field of Classification Search
CPC ............ H01L 21/283; H01L 21/31144; H01L 21/26506; H01L 21/3081; H01L 21/3086; H01L 21/31111; H01L 21/32134; H01L 21/32135
See application file for complete search history.

(56) References Cited

U.S. PATENT DOCUMENTS

| | | | | |
|---|---|---|---|---|
| 7,687,395 B2* | 3/2010 | Yang | ................. | H01L 21/76897 257/E21.577 |
| 8,367,493 B1* | 2/2013 | Ngo | ...................... | H01L 23/291 257/315 |
| 8,481,415 B2* | 7/2013 | Yuan | ................. | H01L 21/76897 438/183 |
| 8,586,469 B2 | 11/2013 | Yeh | | |
| 8,741,723 B2* | 6/2014 | Chi | ........................ | H01L 29/665 438/299 |
| 8,772,102 B2* | 7/2014 | Chi | ........................ | H01L 29/665 438/229 |
| 8,828,813 B2* | 9/2014 | Huang | ................. | H01L 29/0847 257/E21.444 |
| 8,987,136 B2* | 3/2015 | Zhong | ..................... | H01L 29/78 438/149 |
| 2008/0248649 A1* | 10/2008 | Adetutu | ............ | H01L 21/02164 438/692 |

(Continued)

Primary Examiner — Savitr Mulpuri
(74) Attorney, Agent, or Firm — Eschweiler & Associates, LLC

(57) ABSTRACT

Some embodiments of the present disclosure relate to a method to form a source/drain SAC for a transistor. The method comprises forming a pair of gate structures within a first dielectric material on a surface of a substrate, which are isolated from the first dielectric material by an etch stop material. A cap material is formed over the pair of gate structures and the first dielectric material. A pattern of mask material is formed by implanting regions of the cap material with dopants. The implanted regions of the cap material are then removed by a selective etch, which forms the pattern of mask material over each gate structure. The pattern of mask material is configured to shield each gate structure during a subsequent etch step to prevent shorting of the gate structure to the SAC.

20 Claims, 13 Drawing Sheets

(56) References Cited

U.S. PATENT DOCUMENTS

| | | | |
|---|---|---|---|
| 2012/0032238 A1* | 2/2012 | Teo | H01L 21/28518 257/288 |
| 2013/0115773 A1* | 5/2013 | Pal | H01L 21/84 438/697 |
| 2013/0157450 A1* | 6/2013 | Fitz | H01L 21/76897 438/586 |
| 2014/0015104 A1* | 1/2014 | Su | H01L 21/225 257/611 |
| 2015/0021683 A1* | 1/2015 | Xie | H01L 29/6653 257/330 |
| 2015/0064863 A1* | 3/2015 | Adusumilli | H01L 21/283 438/229 |
| 2015/0069532 A1* | 3/2015 | Xie | H01L 29/66545 257/410 |
| 2015/0187905 A1* | 7/2015 | Cai | H01L 29/6681 257/288 |
| 2015/0235897 A1* | 8/2015 | Fu | H01L 21/76879 438/299 |

* cited by examiner

SELF-ALIGNED CONTACT AND METHOD OF FORMING THE SAME

BACKGROUND

Device scaling in advanced semiconductor nodes such as the 10 nm node and beyond has driven the contacted poly pitch (CPP) (i.e., the minimum center-to-center space between gates of adjacent transistors) to less than about 100 nm. Contacts to the source or drain of such transistors must fit within the space between the adjacent gates without shorting either gate to the source or drain. To achieve this, methods such as double or triple-patterning of source/drain contacts have been utilized. However, such multiple-patterning techniques require additional masks and manufacturing overhead. The use of additional masks can also degrade overlay (OVL) control between these contacts, the source or drain of the transistor to which the contact aligns, and adjacent features such as the gate of the transistor from which the contact must remain electrically-isolated to insure yield. Other techniques such as self-aligned contact (SAC) formation can reduce OVL degradation associated with multiple-patterning techniques, but require additional layers in the transistor device stack for proper contact formation.

DETAILED DESCRIPTION

Figure 1A:
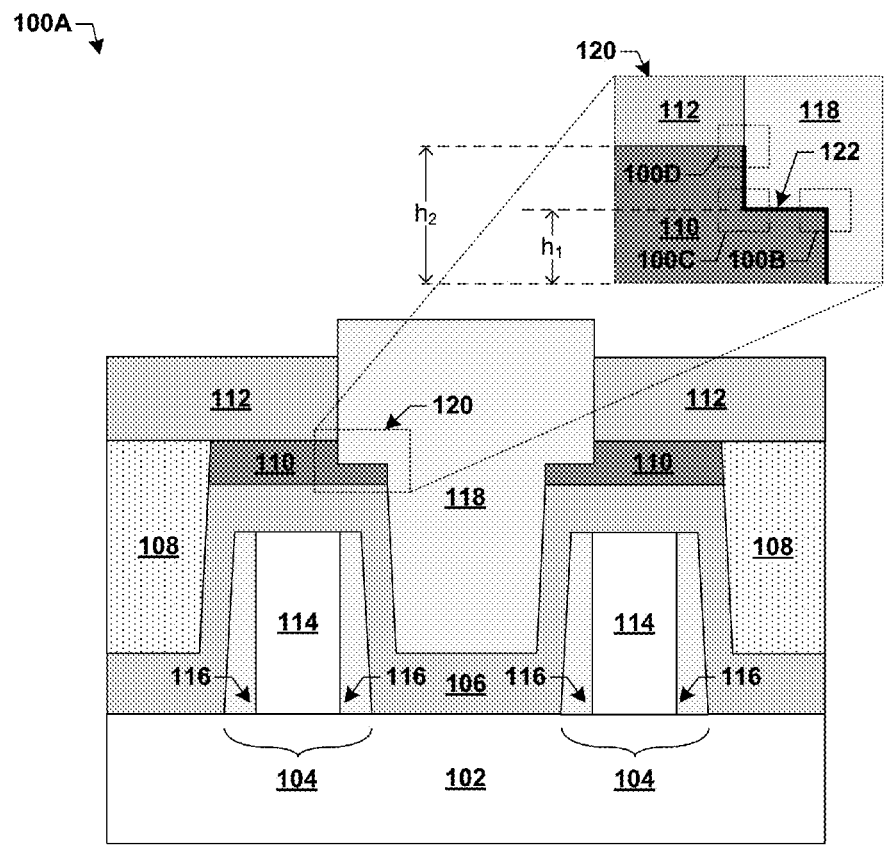
FIGS. 1A-1D illustrate cross-sectional views of some embodiments of a semiconductor device with a source/drain contact disposed between a pair of gate structures.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Some methods of SAC formation utilize a hard mask (HM) material to define a pattern that includes an opening, which is etched to form a recess, and filled with a conductive material to form the SAC (e.g., source/drain contact, gate contact, metal contact, etc.). For source/drain SAC formation on a transistor, an electrically inert material is disposed over a top surface of the transistor (e.g., on the gate, source, and drain). The electrically inert material serves to both isolate the gate from the source/drain SAC and as an etch stop layer for the source/drain recess etch. A dielectric material is then disposed over the transistor and electrically inert material to electrically-isolate the transistor from its surroundings. The dielectric material is then etched over the source or drain of the transistor to form the recess for the source/drain SAC.

The source/drain SAC etch is a selective etch, which utilizes an etchant that has a high degree of selectivity between the electrically inert material and the dielectric material (i.e., it etches the dielectric material at a substantially higher rate than the electrically inert material). As a result, the dielectric material may be etched completely away while the electrically inert material is left substantially intact. This forms the recess for the source/drain SAC while keeping the gate electrically isolated (i.e., not touching) the recess. While the electrically inert material is etched at a substantially slower rate than the dielectric material, it is still etched. In addition, HM misalignment due to OVL variability may result the opening of the HM to shift from the over the source/drain of the transistor to over the gate. Due to the misalignment, the electrically inert material over the gate (particularly at the corner of the gate) is exposed to more etchant than intended by the nominal process, and is subsequently etched more than intended by the nominal process. This can expose the gate to the recess. As a result, the source/drain SAC will contact the gate, and thus electrically short to the gate, when the recess is filled with the conducting material.

Accordingly, some embodiments of the present disclosure relate to a method to form a source/drain SAC for a transistor. The method comprises forming a pair of gate structures within a first dielectric material on a surface of a substrate, which are isolated from the first dielectric material by an etch stop material. A cap material is formed over the pair of gate structures and the first dielectric material. A pattern of mask material is formed by implanting regions of the cap material with dopants. The implanted regions of the cap material are then removed by a selective etch, which forms the pattern of mask material over each gate structure. The pattern of mask material is configured to shield each gate structure during a subsequent etch step to prevent shorting of the gate structure to the SAC. In some embodiments, the implanted regions of the cap material are defined by a surface topology of the substrate. In some embodiments, the implant creates the etch selectivity by transitioning the cap material from a crystalline phase to an amorphous phase. Other embodiments are also disclosed.

FIG. 1A illustrates a cross-sectional view of a semiconductor device 100 formed on a surface of a substrate 102. The semiconductor device 100 includes a pair of gate structures 104 disposed beneath and etch stop material 106 within a first dielectric material 108, and a mask material 110 disposed over each gate structure 104. The source/drain contact 118 is disposed on the etch stop material 106 between the pair of gate structures 104 and on a portion of each mask material 110 over each gate structure 104. The semiconductor device 100 also includes a second dielectric material 112 disposed over each mask material 110 in a region where the source/drain contact 118 is not disposed. Each gate structure 104 comprises a gate electrode 114 residing between spacers 116, which provide electrical isolation between the gate electrode 114 and the source or drain of the semiconductor device 100. In some embodiments, the gate electrodes 114 comprise polysilicon. In some embodiments, the gate electrodes 114 comprise a replacement metal gate (RMG). In various embodiments, the etch stop material 106 comprises silicon-nitride (SiN).

Figure 1B:
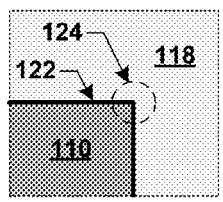

The semiconductor device 100 includes a first interface 122 formed between the mask material 110 and source/drain contact 118. FIG. 1B illustrates a cross-sectional view of some embodiments of a first region 100B of the first interface 122, where a surface of the source/drain contact 118 forms a concave vertex 124 with the mask material 110 along the first interface 122. The mask material 110 disposed over each gate structure 104 has a first height ($h_1$) below the source/drain contact 118 and a second height ($h_2$) below the second dielectric material 112 that is greater than the first height ($h_1$) (i.e., $h_2 > h_1$), where $h_1$ and $h_2$ are in a range of about 100 angstroms to 500 angstroms. This "step" in height of the mask material 110 results from the method of source/drain contact 118 formation disclosed in subsequent embodiments.

Figure 1C:
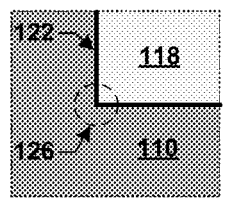
Figure 1D:
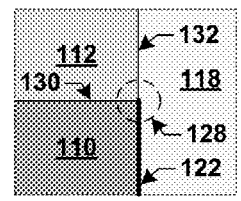

FIG. 1C illustrates a cross-sectional view of some embodiments of a second region 100C of the first interface 122, where the step in height of the mask material 110 also causes the surface of the source/drain contact 118 to form a convex vertex 126 with the mask material 110 along the first interface 122. FIG. 1D illustrates a cross-sectional view of some embodiments of a third region 100D of the first interface 122, where the first interface 122 terminates. The first interface 122 terminates at a second interface 130 between the mask material 110 and the second dielectric material 112. The first interface 122 is also co-planar with a third interface 132 formed between the second dielectric material 112 and source/drain contact 118 at a termination point 128 of the first interface 122. Note that for the embodiments of FIGS. 1A-1D that the concave and convex vertices 124, 126 are shown to form at 90-degree angles. In realty these vertices will be rounded due to corner rounding of the mask material 110 and the source/drain contact 118.

Note that the semiconductor device 100A of FIGS. 1A-1D does not represent the final on-wafer configuration of the semiconductor device 100A. The semiconductor device 100A is planarized through a chemical-mechanical polish (CMP) process to remove the mask material 110 and the second dielectric material 112 above the source/drain contact 118 for subsequent middle-of-line (MOL) and back-end-of-line (BEOL) processing, as is illustrated in the embodiments of FIGS. 2A-2J.

Figure 2A:
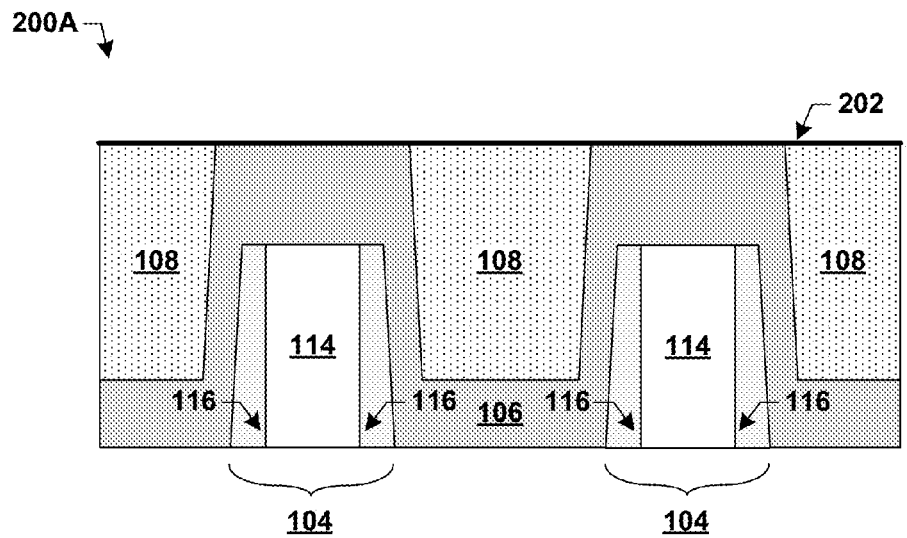
FIGS. 2A-2J illustrate cross-sectional views of some embodiments of source/drain contact formation.

FIGS. 2A-2J illustrate cross-sectional views of some embodiments of source/drain contact formation. FIG. 2A illustrates a cross-sectional view of a semiconductor substrate 200A, whereupon a pair of gate structures 104 are formed within a first dielectric material 108. An etch stop material 106 is formed over the pair of gate structures 104, and beneath the first dielectric material 108. Subsequent to the formation of these structures, a chemical-mechanical polish (CMP) is performed to produce a planar surface 202 of the semiconductor substrate 200A.

Figure 2B:
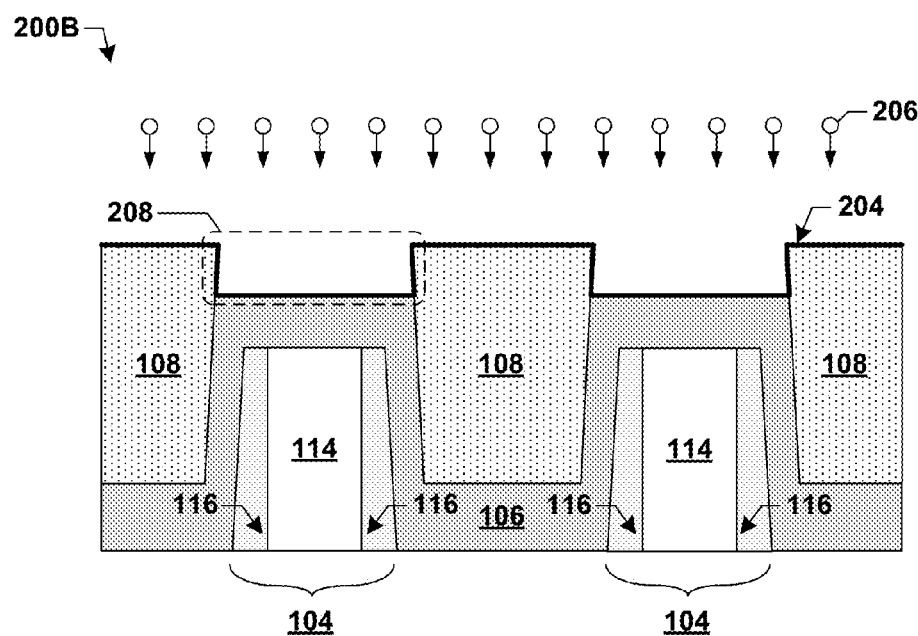

FIG. 2B illustrates a cross-sectional view of a semiconductor substrate 200B, comprising semiconductor substrate 200A, where a non-planar surface 204 is formed by performing a first selective etch of the planar surface 202 of FIG. 2A. The first selective etch uses a first selective etchant 206 to remove the etch stop material 106 over each gate structure 104, which to form a recess 208 over each gate structure 104. The first selective etchant 206 is configured to etch the etch stop material 106 at a substantially higher rate (e.g., about 10x) than the first dielectric material 108. The first selective etch is followed by a bake step.

Figure 2C:
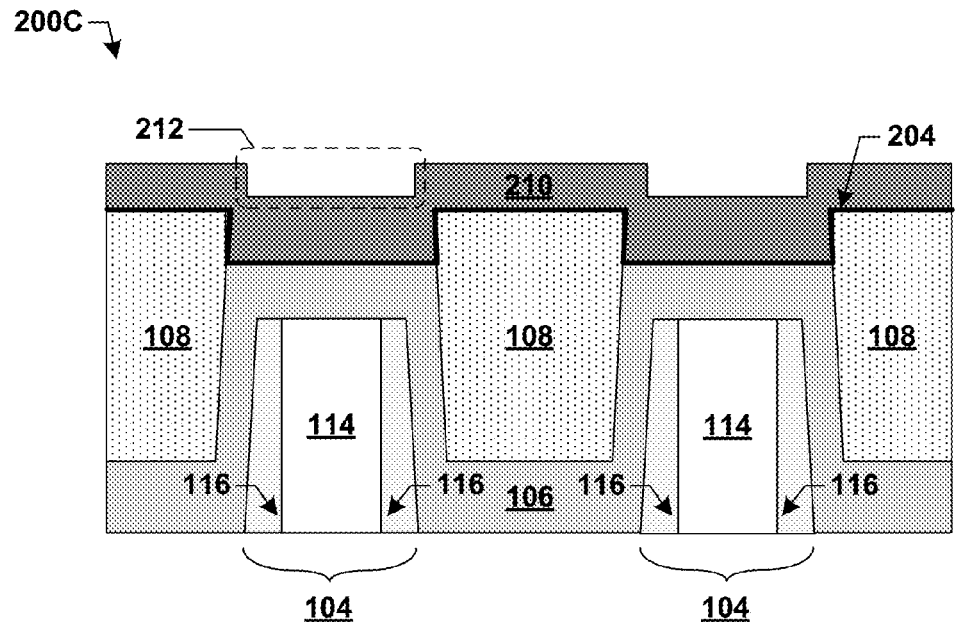

FIG. 2C illustrates a cross-sectional view of a semiconductor substrate 200C, comprising semiconductor substrate 200B, where a cap material 210 is disposed over the non-planar surface 204. In various embodiments, disposal of the cap material 210 includes disposal of amorphous silicon (a-Si) by atomic layer deposition (ALD), or other appropriate epitaxial technique. In these embodiments, the semiconductor substrate 200B is subjected to an anneal after the deposition of the cap material 210 to transition it from the a-Si phase to a crystalline silicon (c-Si) phase. In some embodiments, the anneal includes a thermal budget including a temperature in a range of about 250° C. to about 750° C. and a duration in a range of about 5 minutes to about 5 hours. The resulting cap material 210 has a substantially uniform thickness such that it conforms to a topology of the non-planar surface 204, which results in a recessed area 212 over each gate structure.

Figure 2D:
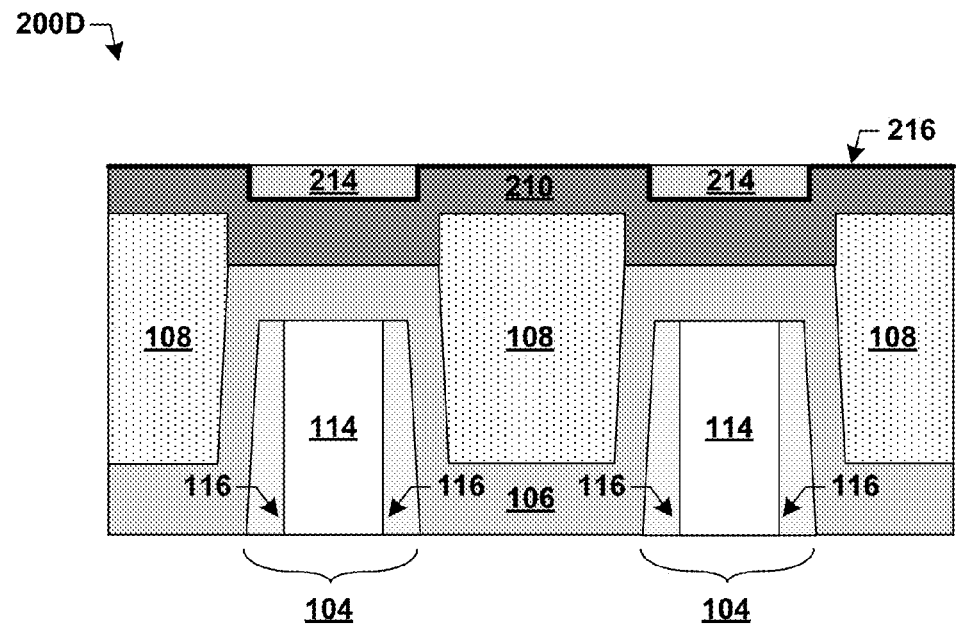

FIG. 2D illustrates a cross-sectional view of a semiconductor substrate 200D, comprising semiconductor substrate 200C, where a photoresist (PR) material 214 is disposed above the cap material 210. Disposal of the PR material 214 may be accomplished in a spin-on tool, where the PR material 214 is spun-on to a top surface 216 of the cap material 210, and excess PR material 214 is removed above the top surface. Removal of the excess PR material 214 may be achieved by a bake of the PR material 214 followed by an etch of the excess PR material 214 above the top surface 216. As a result, the remaining PR material 214 resides within the recessed areas 212 over each gate structure 104. In addition, the combined remaining PR material 214 and cap material 210 form a substantially planar top surface (see, 218 of FIG. 2E). In some embodiments, the cap material 210 comprises silicon.

Figure 2E:
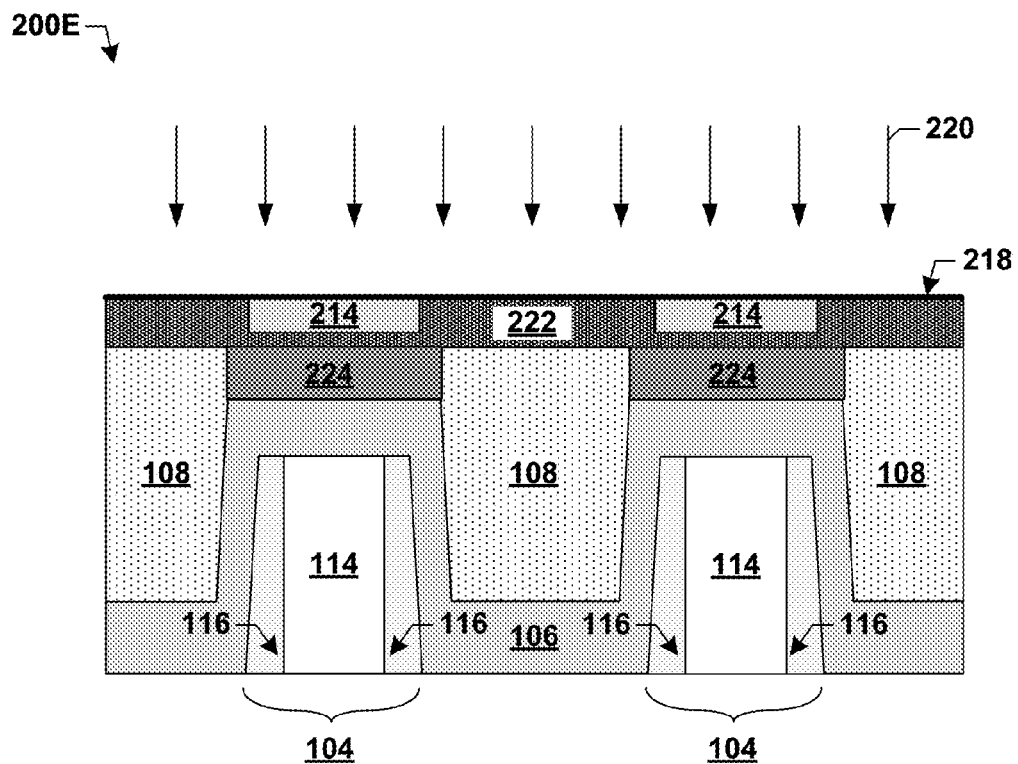

FIG. 2E illustrates a cross-sectional view of a semiconductor substrate 200E, comprising semiconductor substrate 200D, where the semiconductor substrate 200E is subjected to an implant 220 of dopants through the substantially planar top surface 218. The implanted dopants are absorbed by first regions 222 of the cap material 210, but are blocked from reaching second regions 224 of the cap material 210. In some embodiments the dopants comprise arsenic, boron, germanium, oxygen, phosphorous, or a combination thereof. In some embodiments, the dopants are implanted with an energy in a range between about 1 keV and about 100 keV. In some embodiments, the dopants are implanted with a dose in a range of between about $1e13\ cm^{-3}$ and about $1e17\ cm^{-3}$.

Figure 2F:
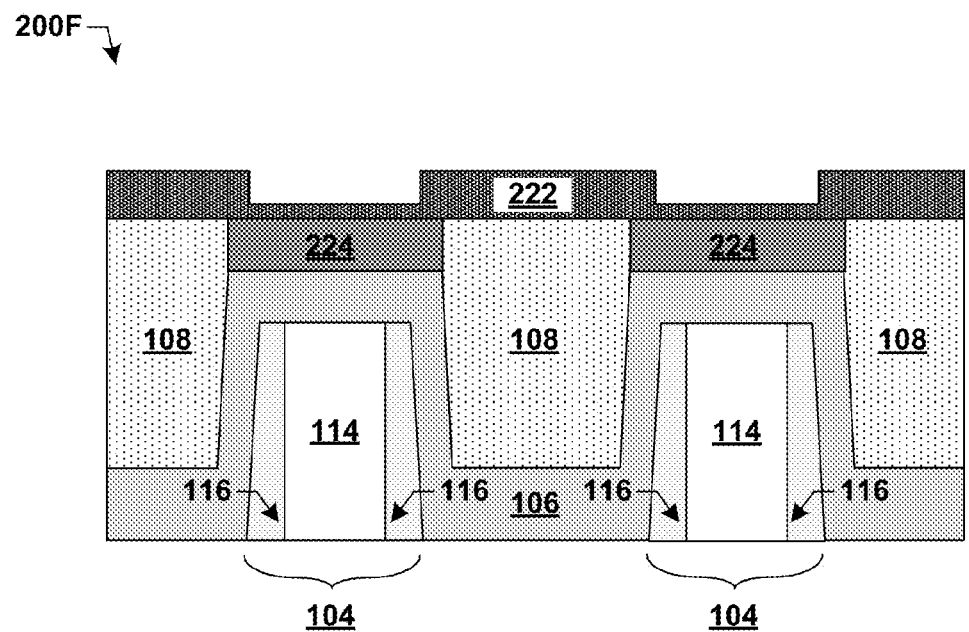

FIG. 2F illustrates a cross-sectional view of a semiconductor substrate 200F, comprising semiconductor substrate 200E, where the PR material 214 has been removed from the recessed areas 212. The implant 220 of the cap material 210 creates an etch selectivity between the implanted first regions 222 and non-implanted second regions 224. In some embodiments, the implant 220 causes the first regions 222 to become amorphous (e.g., a-Si) while leaving the second regions crystalline (e.g., c-Si). In these embodiments, an appropriate etchant with a high etch selectivity between the amorphous first regions 222 and crystalline second regions 224 is then used to remove the amorphous first regions 222 of the cap material 210.

Figure 2G:
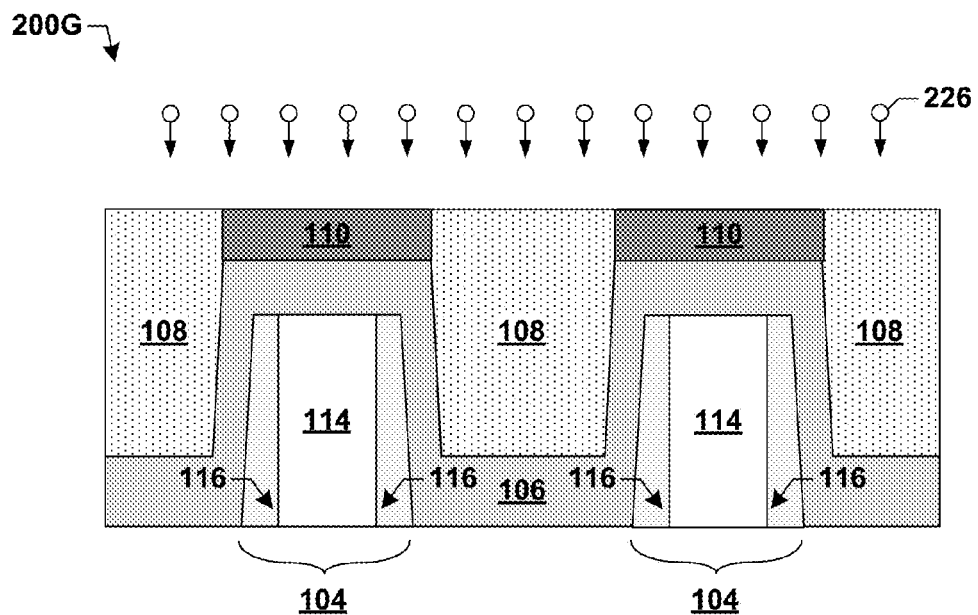

FIG. 2G illustrates a cross-sectional view of a semiconductor substrate 200G, comprising semiconductor substrate 200F, where a second selective etch on the cap material 210 is performed with a second selective etchant 226 that removes the first regions 222 and forms a pattern of the mask material 110 (from the second regions 224). In some embodiments, the second selective etch includes a wet etch and the second selective etchant 226 includes ammonia ($NH_3$), water ($H_2O$), or a combination thereof. In some embodiments, the second selective etch includes a dry etch and the second selective etchant 226 includes chlorine ($Cl_2$), nitrogen trifluoride ($NF_3$), or a combination thereof.

Figure 2H:
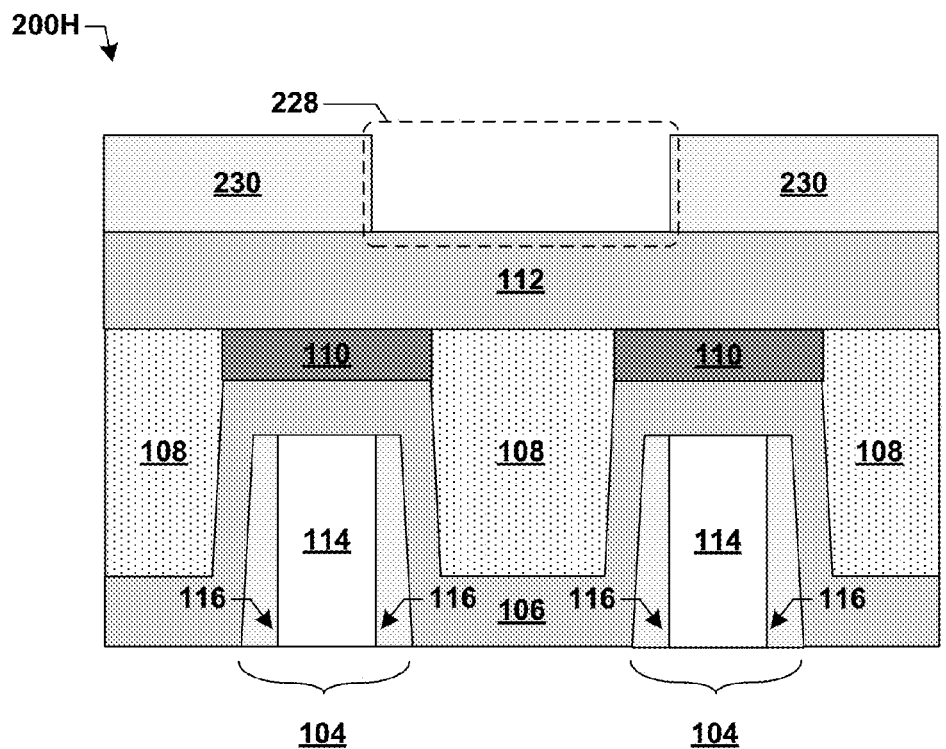

FIG. 2H illustrates a cross-sectional view of a semiconductor substrate 200H, comprising semiconductor substrate 200G, where a second dielectric material 112 is formed over the first dielectric material 108 and the pattern of the mask material 110. A PR pattern is then formed, including an opening 228 in a PR material 230 between the pair of gate structures 104. In some embodiment, the PR material 230 comprises a "tri-layer" PR, which includes a carbon-containing layer formed over the second dielectric material 112, an HM layer formed over the carbon-containing layer, and a PR layer formed over the HM layer. The PR layer is then patterned through photolithography, and the pattern is transferred to the HM layer and carbon-containing layer to form the opening 228.

Figure 2I:
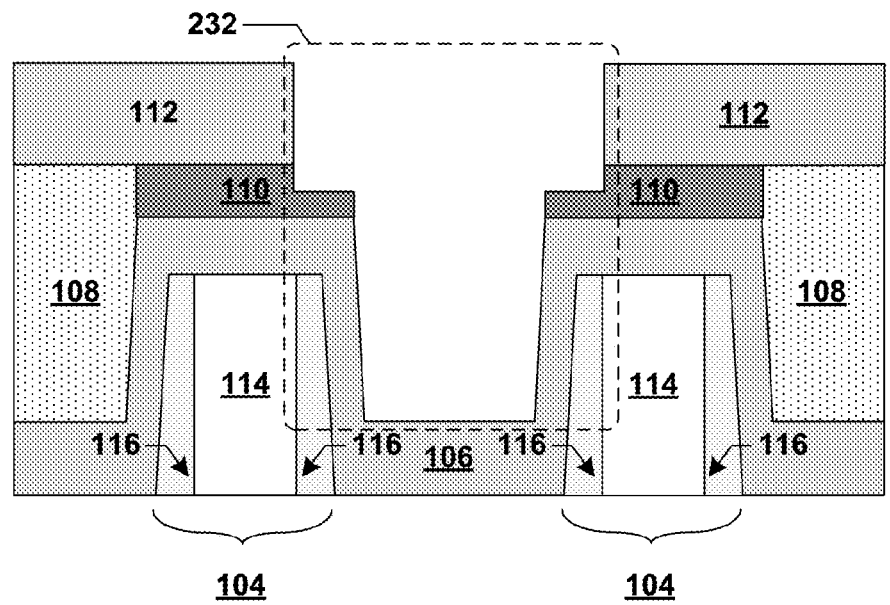

FIG. 2I illustrates a cross-sectional view of a semiconductor substrate 200I, comprising semiconductor substrate 200H, where an etch of the first dielectric material 108 has been performed through the opening 228 in the PR material 230 to form a contact recess 232. The etch of the first dielectric material 108 removes the first dielectric material 108 between the pair of gate structures 1004, while using the PR material 230 and the mask material 110 to block etching of the pair of gate structures 104.

Figure 2J:
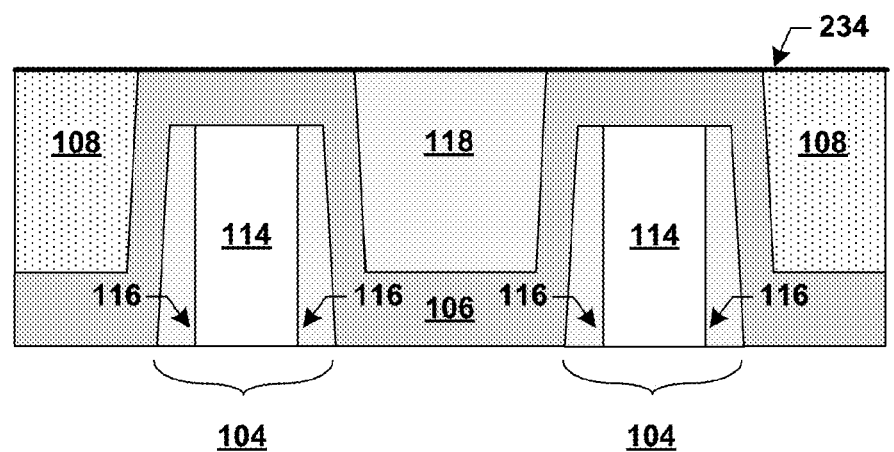

FIG. 2J illustrates a cross-sectional view of a semiconductor substrate 200J, comprising semiconductor substrate 200I, where the contact recess 232 has been filled with a conductive material to form a source/drain contact 118. The semiconductor substrate 200J is then planarized through a CMP process to remove the mask material 110 and the second dielectric material 112, which forms a planar surface 234 above the source/drain contact 118. The semiconductor substrate 200J is subsequently subjected middle-of-line (MOL) and back-end-of-line (BEOL) processing to complete semiconductor device formation.

Figure 3A:
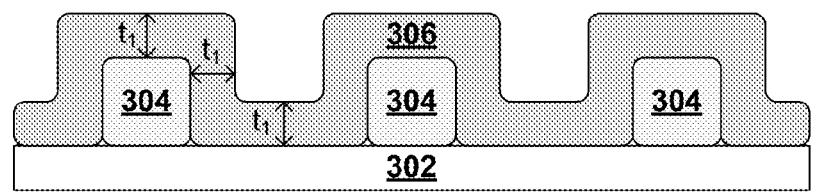
FIGS. 3A-3D illustrate cross-sectional views of some embodiments forming a substrate surface topology through a selective etch.

FIGS. 3A-3D illustrate cross-sectional views of some embodiments forming a substrate surface topology through a selective etch. FIG. 3A illustrates a cross-sectional view of some embodiments of a device structure 300A including a substrate 302, whereon a plurality of structures 304 (e.g., gate structures) are disposed that create the surface topology of the substrate 302. The device structure 300A also includes a first material 306 (e.g., an etch stop material) of a first uniform thickness ($t_1$) disposed over the plurality of structures 304.

Figure 3B:
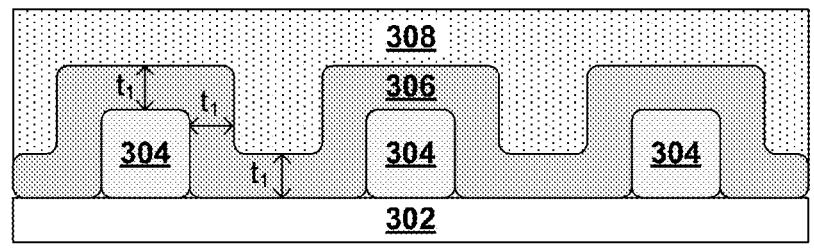
Figure 3C:
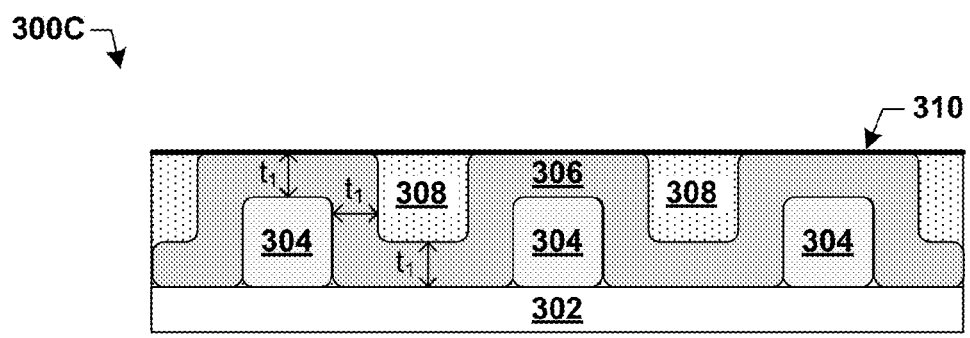
Figure 3D:
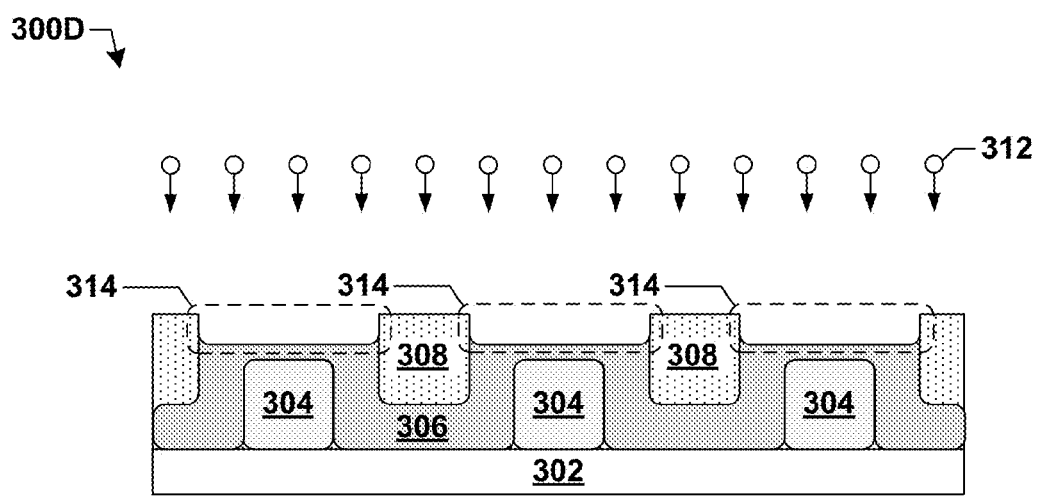

FIG. 3B illustrates a cross-sectional view of some embodiments of a device structure 300B, comprising device structure 300A where a second material 308 (e.g., a dielectric material) is disposed over the first material at a position above and between the plurality of structures 304. FIG. 3C illustrates a cross-sectional view of some embodiments of a device structure 300C, comprising device structure 300B where a planar surface 310 is formed by a CMP or other planarizing process. The planar surface 310 comprises the first material 306 and the second material 308. FIG. 3D illustrates a cross-sectional view of some embodiments of a device structure 300D, comprising device structure 300C where a selective etch is performed to the planar surface 310. The selective etch utilizes an etchant 312 that selectively etches the first material 306 at a substantially higher rate (e.g., in a range of about 5× to about 10×) than the second material 308 to form first recesses 314 in the planar surface 310. The selective etch therefore forms a substrate surface topology comprising the first recesses 314 (see, 402 of FIG. 4A).

Figure 4A:
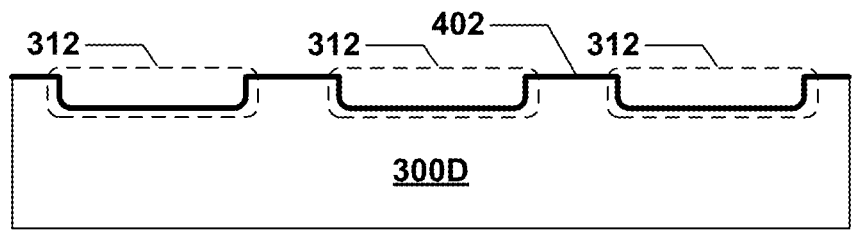
FIGS. 4A-4F illustrate cross-sectional views of some embodiments of utilizing a surface topology of a substrate to form a pattern of mask material.

FIGS. 4A-4D illustrate cross-sectional views of some embodiments of utilizing a surface topology of a substrate to form a pattern of mask material. FIG. 4A illustrates a cross-sectional view of some embodiments of the substrate 400A comprising device structure 300D. The substrate 400A has a first surface topology 402, which includes the first recesses 314 formed by the selective etch of the embodiments of FIG. 3D.

Figure 4B:
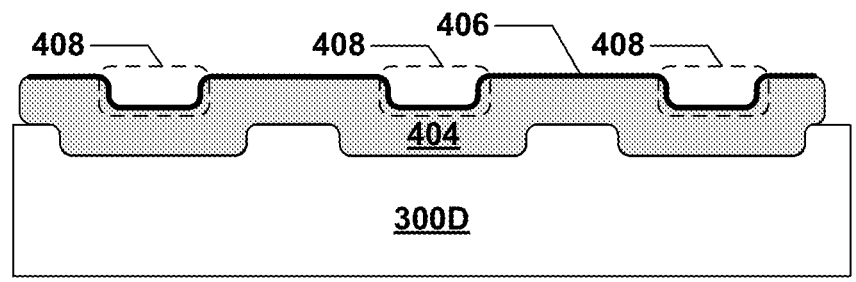

FIG. 4B illustrates a cross-sectional view of some embodiments of a substrate 400B, comprising the substrate 400A, whereupon a cap material 404 is formed, and where the cap material 404 has a second surface topology 406 which is the same as the first surface topology 402. The second surface topology 406 also includes second recesses 408 formed over the first recesses 314.

Figure 4C:
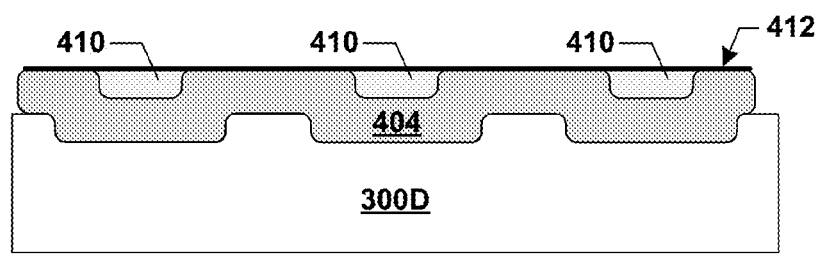

FIG. 4C illustrates a cross-sectional view of some embodiments of a substrate 400C, comprising the substrate 400B, whereupon a PR material 410 is formed within the second recesses 408 of the second surface topology 406, resulting in a planar surface 412 comprising the cap and PR materials 404, 410.

Figure 4D:
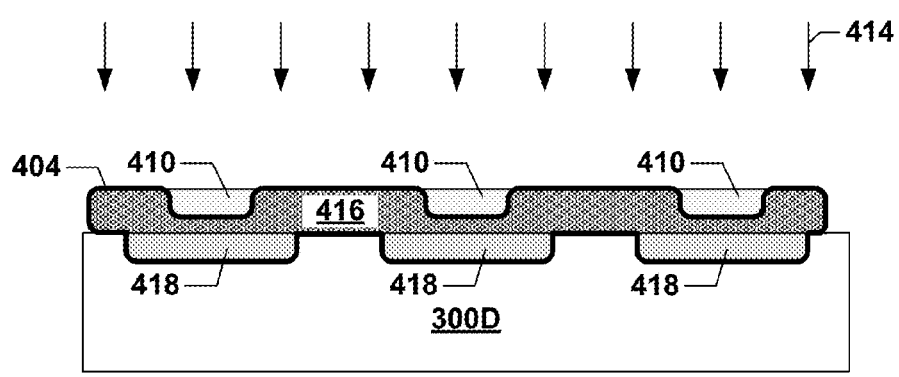

FIG. 4D illustrates a cross-sectional view of some embodiments of a substrate 400D, comprising the substrate 400C, where a first region 416 of the cap material 404 is subjected to an implant 414 of dopants. Simultaneously, second regions 418 of the cap material 404 below the PR material 410 are shielded from the implant 414. The implant 414 creates an etch selectivity between the first region 416 and the second regions 418 of the cap material 404. In some embodiments, the cap material 404 initially comprises a crystalline phase (e.g., c-Si). In these embodiments, the implant 414 creates the etch selectivity between the first region 416 and the second regions 418 by transitioning the cap material 404 within the first region 416 from the crystalline phase to an amorphous phase (e.g., a-Si), while leaving the cap material 404 within the second regions 418 in the crystalline phase.

Figure 4E:
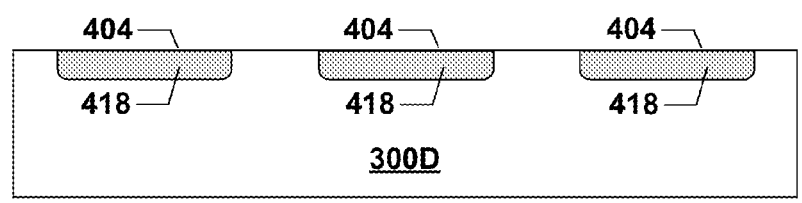

FIG. 4E illustrates a cross-sectional view of some embodiments of a substrate 400E, comprising the substrate 400D where the PR material 410 has been removed and the first region 416 of the cap material 404 has been etched away. Removing the first region 416 of the cap material us performed with a selective etch that removes the implanted cap material 404 in the first region 416 at a substantially faster rate than the un-implanted cap material 404 in the second regions 418. This results in a pattern formed by the remaining cap material 404 in the second regions 418.

Figure 4F:
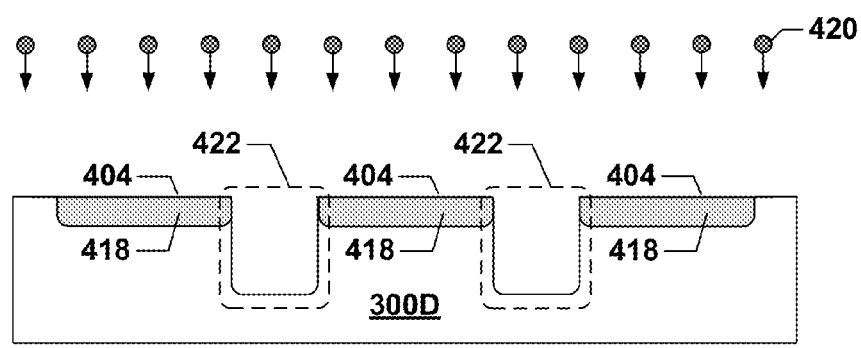

FIG. 4F illustrates a cross-sectional view of some embodiments of a substrate 400F, comprising the substrate 400E where the un-implanted cap material in the second regions 418 is used as a mask material (e.g., 110) in a subsequent etch. The subsequent etch utilizes an etchant 420 to form recesses 422 in regions of the substrate 400F not shielded by the mask material in the second regions 418.

Figure 5:
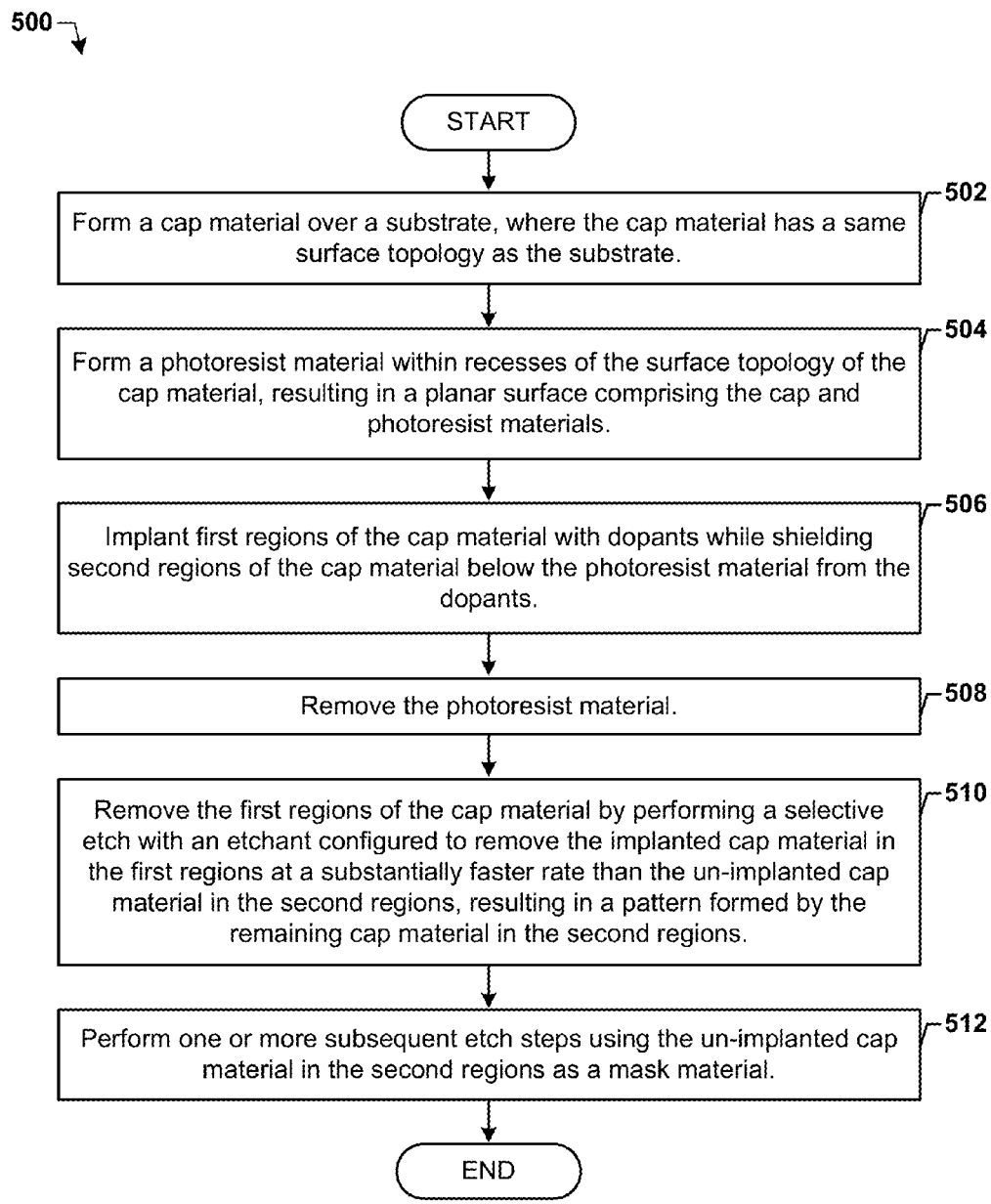
FIG. 5 illustrates some embodiments of a method of utilizing a surface topology of a substrate to form a pattern of mask material.

FIG. 5 illustrates some embodiments of a method 500 of utilizing a surface topology of a substrate to form a pattern of mask material. While the method 500, and subsequently method 600, are described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502 a cap material is formed over a substrate, where the cap material has a same surface topology as the substrate.

At 504 a photoresist material is formed within recesses of the surface topology of the cap material, resulting in a planar surface comprising the cap and photoresist materials.

At 506 first regions of the cap material are implanted with dopants, while second regions of the cap material below the photoresist material are shielded from the dopants. The implant creates an etch selectivity between the first and second regions of the cap material.

At 508 the photoresist material is removed.

At 510 the first regions of the cap material are removed by performing a selective etch with an etchant configured to remove the implanted cap material in the first regions at a substantially faster rate than the un-implanted cap material in the second regions. The selective etch results in a pattern formed by the remaining cap material in the second regions.

At 512 the un-implanted cap material in the second regions is used as a mask material in one or more subsequent etch steps.

Figure 6:
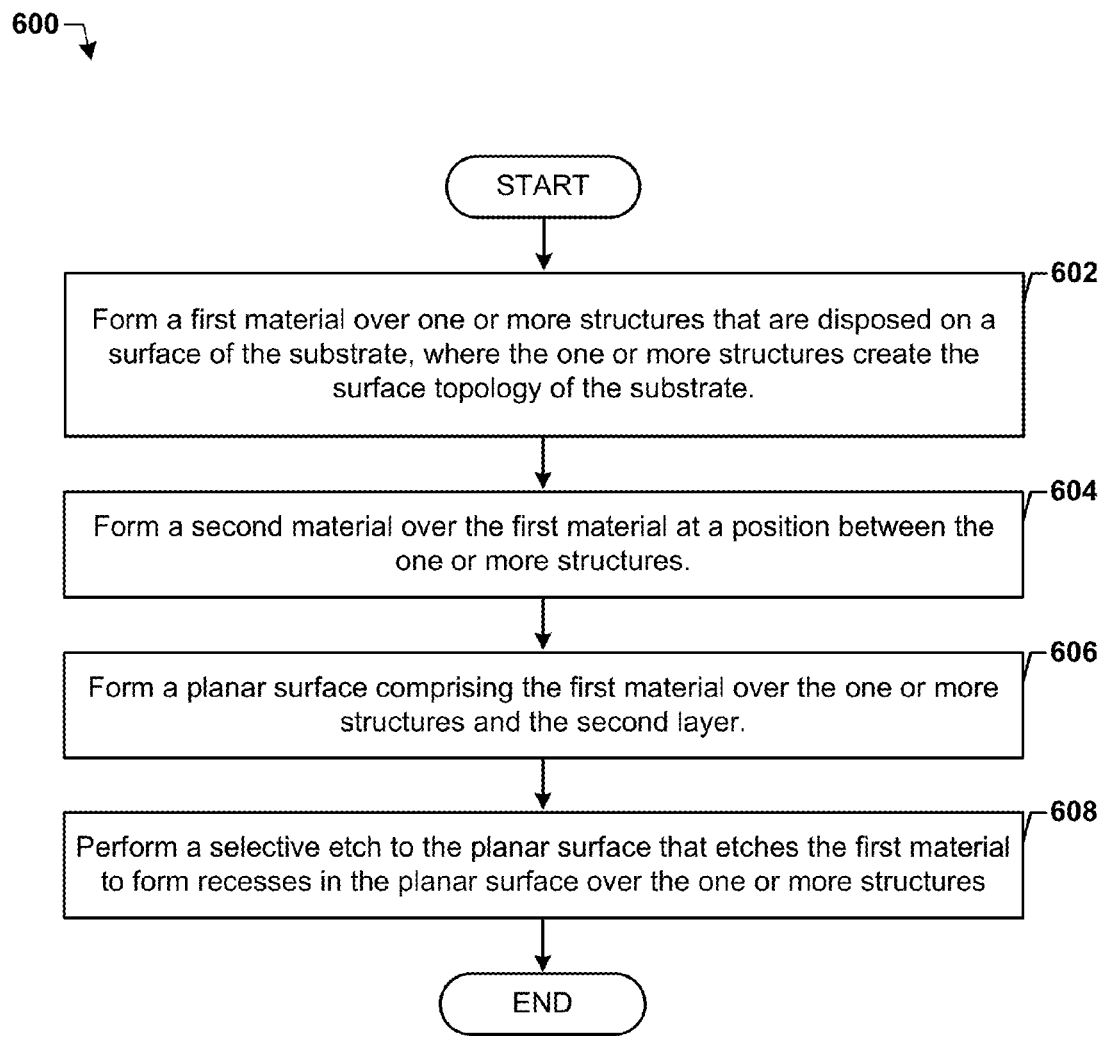
FIG. 6 illustrates some embodiments of a method of forming a substrate surface topology through a selective etch.

FIG. 6 illustrates some embodiments of a method of forming a substrate surface topology through a selective etch.

At 602 a first material is formed over one or more structures that are disposed on a surface of the substrate, where the one or more structures create the surface topology of the substrate.

At 604 a second material is formed over the first material at a position between the one or more structures.

At 606 a planar surface is formed comprising the first material over the one or more structures and the second material.

At 608 a selective etch is performed to the planar surface that etches the first material to form recesses in the planar surface over the one or more structures.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to a method to form a source/drain SAC for a transistor. The method comprises forming a pair of gate structures within a first dielectric material on a surface of a substrate, which are isolated from the first dielectric material by an etch stop material. A cap material is formed over the pair of gate structures and the first dielectric material. A pattern of mask material is formed by implanting regions of the cap material with dopants. The implanted regions of the cap material are then removed by a selective etch, which forms the pattern of mask material over each gate structure. The pattern of mask material is configured to shield each gate structure during a subsequent etch step to prevent shorting of the gate structure to the SAC. In some embodiments, the implanted regions of the cap material are defined by a surface topology of the substrate. In some embodiments, the implant creates the etch selectivity by transitioning the cap material from a crystalline phase to an amorphous phase.

In some embodiments, the present disclosure relates to a method of utilizing a surface topology of a substrate to form a pattern of mask material over the substrate. The method comprises forming a cap material over a substrate, where the cap material has a same surface topology as the substrate. The method further comprises forming a photoresist material within recesses of the surface topology of the cap material, resulting in a planar surface comprising the cap and photoresist materials. The method further comprises implanting first regions of the cap material with dopants while shielding second regions of the cap material below the photoresist material from the dopants, where the implant creates an etch selectivity between the first and second regions of the cap material.

In some embodiments, the present disclosure relates to a method of forming a source/drain contact comprising forming a pair of gate structures within a first dielectric material on a surface of a substrate. The method further comprises forming a cap material over the pair of gate structures and the first dielectric material. The method further comprises forming a mask material over each gate structure by implanting regions of the cap material with dopants, and removing the implanted regions of the cap material. The method further comprises removing the first dielectric material in regions not covered by the mask material to form a recess, and filling the recess with a conducting material to form the source/drain contact.

In some embodiments, the present disclosure relates to a method of forming a source/drain contact, comprising forming an etch stop material over a pair of gate structures and forming the first dielectric material over the etch stop material at a position between the pair of gate structures. The method further comprises forming a planar surface comprising the etch stop material over each gate structure and the first dielectric material. The method further comprises performing a first selective etch of the planar surface with a first selective etchant that removes the etch stop material over each gate structure resulting in a non-planar surface. The method further comprises forming the cap material over the non-planar surface comprising a recessed area over each gate structure resulting from a topology of the non-planar surface.

What is claimed is:

1. A method of forming a source/drain contact, comprising:
   forming a pair of gate structures within a first dielectric material on a surface of a substrate;
   forming a cap material over the pair of gate structures and the first dielectric material;
   forming a mask material over each gate structure by implanting upper regions of the cap material with dopants while lower regions of the cap material are left un-doped or are left doped at a lower dopant concentration than the upper regions of the cap material, and removing the upper regions of the cap material to expose an upper surface of the first dielectric material while the lower regions of the cap material are left in place to establish the mask material; and
   removing the first dielectric material in regions not covered by the mask material.

2. The method of claim 1, wherein the cap material comprises silicon.

3. The method of claim 1, wherein the forming of the mask material comprises:
   forming an etch stop material over the pair of gate structures;
   forming the first dielectric material over the etch stop material at a position between the pair of gate structures;
   forming a planar surface comprising the etch stop material over each gate structure and the first dielectric material;
   forming a non-planar surface by performing a first selective etch of the planar surface with a first selective etchant that removes the etch stop material over each gate structure; and forming the cap material over the non-planar surface comprising a recessed area over each gate structure resulting from a topology of the non-planar surface.

4. The method of claim 3, further comprising:
disposing a photoresist material within recessed area over each gate structure;
performing an implant of first regions of the cap material with dopants while blocking the dopants from reaching second regions of the cap material; and
performing a second selective etch on the cap material with a second selective etchant that removes the first regions and forms a pattern of the mask material from the second regions.

5. The method of claim 4, wherein the second selective etchant comprises ammonia, water, or a combination thereof.

6. The method of claim 4, wherein the second selective etchant comprises chlorine, nitrogen trifluoride, or a combination thereof.

7. The method of claim 4, further comprising:
forming the cap material by disposing an amorphous material over the pair of gate structures and first dielectric material and annealing the amorphous material to form a crystalline material; and
implanting the crystalline material with the dopants to create an etch selectivity between the first and second regions.

8. The method of claim 7, wherein the implant causes the first regions to transition to an amorphous phase while leaving the second regions in a crystalline phase, resulting in an etch selectivity between the amorphous and crystalline regions.

9. The method of claim 1, wherein the removing of the first dielectric material further comprises:
etching the first dielectric material between the pair of gate structures to create a recess that exposes the surface of the substrate, while using the mask material to block etching of the pair of gate structures; and
forming the source/drain contact which is electrically connected to the surface of the substrate by filling the recess with a conductive material.

10. The method of claim 9, where the etching of the first dielectric material comprises:
forming a second dielectric material over the first dielectric material and second regions of cap material;
forming a photoresist pattern comprising an opening in a photoresist material between the pair of gate structures; and
etching through the opening in the photoresist pattern while using the photoresist pattern and the mask material to block etching of the pair of gate structures.

11. The method of claim 1, wherein the dopants comprise arsenic, boron, germanium, oxygen, phosphorous, or a combination thereof.

12. A method of forming a source/drain contact, comprising:
forming an etch stop material over a pair of gate structures;
forming a first dielectric material over the etch stop material at a position between the pair of gate structures;
forming a planar surface comprising the etch stop material over each gate structure and the first dielectric material;
performing a first selective etch of the planar surface with a first selective etchant that removes the etch stop material over each gate structure resulting in a non-planar surface; and
forming a cap material over the non-planar surface comprising a recessed area over each gate structure resulting from a topology of the non-planar surface.

13. The method of claim 12, further comprising:
forming a photoresist material within the recessed area over each gate structure;
performing an implant of first regions of the cap material with dopants while blocking the dopants from reaching second regions of the cap material; and
performing a second selective etch on the cap material with a second selective etchant that removes the first regions and forms a pattern of mask material from the second regions.

14. The method of claim 13, further comprising:
forming the cap material by disposing an amorphous material over the pair of gate structures and first dielectric material and annealing the amorphous material to form a crystalline material; and
performing an implant of the crystalline material with the dopants to create an etch selectivity between the first and second regions;
wherein the implant causes the first regions to transition to an amorphous phase while leaving the second regions in a crystalline phase, resulting in an etch selectivity between the amorphous and crystalline regions.

15. The method of claim 14, wherein the removing of the first dielectric material further comprises:
forming a second dielectric material over the first dielectric material and second regions of cap material;
forming a photoresist pattern comprising an opening in a photoresist material between the pair of gate structures; and
etching through the opening in the photoresist pattern to etch away the first dielectric material while using the photoresist pattern and the mask material to block etching of the pair of gate structures.

16. A method, comprising:
forming a pair of gate structures on a surface of a semiconductor substrate;
forming a first dielectric material between neighboring sidewalls of the pair of gate structures;
forming a cap layer including sunken cap regions over the pair of gate structures and a raised cap region over the first dielectric material, wherein an upper surface of the raised cap region is higher than upper surfaces of the sunken cap regions;
implanting the raised cap region with dopants and leaving the sunken cap regions un-doped or doped at a lower doping concentration than the raised cap region, and selectively removing the implanted raised cap region to expose an upper surface of the first dielectric material while leaving the sunken cap regions over the pair of gate structures;
removing the first dielectric material to form a recess that exposes the surface of the semiconductor substrate between the pair of gate structures; and
filling the recess with conductive material to form a source/drain contact which is electrically connected to the surface of the semiconductor substrate between the pair of gate structures.

17. The method of claim 16, further comprising:
prior to forming the first dielectric material, forming a conformal etch stop layer lining upper surfaces and sidewalls of the pair of gate structures and lining the surface of the semiconductor substrate between the pair of gate structures, wherein the first dielectric material is subsequently formed over the conformal etch stop layer so upper surfaces of the conformal etch stop layer are co-planar with an upper surface of the first dielectric material.

18. The method of claim 17, further comprising:
- selectively recessing the upper surfaces of the conformal etch stop layer over the gate structures, such that the recessed upper surfaces of the conformal etch stop layer are recessed to a height below the upper surface of the first dielectric material; and
- wherein the cap layer is a conformal layer and the raised cap region is disposed on the upper surface of the first dielectric material and the sunken cap regions are disposed on the recessed upper surfaces of the conformal etch stop layer.

19. The method of claim 18, further comprising:
- forming a mask over the sunken cap regions such that the mask has upper surfaces that are co-planar with an upper surface of the raised cap region; and
- wherein the mask is configured to block or deter the dopants from being implanted into the sunken cap regions to facilitate an etch selectivity between the raised cap region and the sunken cap regions.

20. The method of claim 16, wherein removing the first dielectric material to form the recess comprises:
- after selectively removing the implanted raised cap regions, forming a second dielectric layer over an upper surface of the first dielectric material and over upper surfaces of the sunken cap regions;
- forming a photoresist mask over the second dielectric layer, the photoresist mask having an opening exposing an upper surface region of the second dielectric layer over the first dielectric material; and
- performing an etch with the photoresist mask in place to establish an opening in the second dielectric layer and to remove the first dielectric material to form the recess while the sunken cap regions protect upper surfaces of the pair of gate structures.

* * * * *